(12) United States Patent
Zhao

(10) Patent No.: US 11,329,073 B2
(45) Date of Patent: May 10, 2022

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jinrong Zhao, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 63 days.

(21) Appl. No.: 16/960,102

(22) PCT Filed: Dec. 23, 2019

(86) PCT No.: PCT/CN2019/127333
§ 371 (c)(1),
(2) Date: Jul. 6, 2020

(87) PCT Pub. No.: WO2021/082235
PCT Pub. Date: May 6, 2021

(65) Prior Publication Data
US 2021/0126021 A1    Apr. 29, 2021

(30) Foreign Application Priority Data
Oct. 29, 2019   (CN) .................. 201911039847.X

(51) Int. Cl.
*H01L 27/12*   (2006.01)
*H01L 27/32*   (2006.01)

(52) U.S. Cl.
CPC ...... *H01L 27/1248* (2013.01); *H01L 27/3258* (2013.01)

(58) Field of Classification Search
CPC ....... H01L 27/1214–1296; H01L 27/32–3297; H01L 2251/5338
See application file for complete search history.

(56) References Cited

U.S. PATENT DOCUMENTS

| 10,446,062 B2* | 10/2019 | Li | H01L 27/3276 |
| 2015/0108484 A1* | 4/2015 | Park | H01L 27/3248 257/71 |

(Continued)

FOREIGN PATENT DOCUMENTS

| CN | 104795403 A | 7/2015 |
| CN | 105870126 A | 8/2016 |

(Continued)

OTHER PUBLICATIONS

PCT International Search Report for International Application No. PCT/CN2019/127333, dated Jun. 23, 2020, 6pp.

(Continued)

*Primary Examiner* — Bryan R Junge
(74) *Attorney, Agent, or Firm* — The Roy Gross Law Firm, LLC; Roy Gross

(57) ABSTRACT

A display panel includes: a substrate; a thin film transistor layer, wherein the thin film transistor layer is disposed on the substrate an organic layer; and a via, wherein the via is disposed on the thin film transistor layer, and a part of the organic layer extends to the via.

8 Claims, 3 Drawing Sheets

(56) References Cited

U.S. PATENT DOCUMENTS

| | | | | |
|---|---|---|---|---|
| 2016/0111551 A1* | 4/2016 | Yan | .................... | H01L 29/66742 |
| | | | | 438/479 |
| 2016/0365364 A1* | 12/2016 | Li | ...................... | H01L 29/78603 |
| 2019/0131368 A1* | 5/2019 | Zhang | ................. | H01L 27/3262 |
| 2019/0148476 A1* | 5/2019 | Park | .................... | H01L 27/1222 |
| | | | | 257/40 |
| 2019/0267440 A1* | 8/2019 | Park | .................... | H01L 51/5218 |
| 2020/0194526 A1* | 6/2020 | Zhang | ................ | H01L 27/3246 |
| 2020/0303479 A1* | 9/2020 | Kim | .................... | H01L 27/3258 |
| 2020/0310493 A1* | 10/2020 | Kim | ...................... | G06F 1/1652 |

FOREIGN PATENT DOCUMENTS

| | | | |
|---|---|---|---|
| CN | 107359177 | A | 11/2017 |
| CN | 107424957 | A | 12/2017 |
| CN | 107946247 | A | 4/2018 |
| CN | 108550612 | A | 9/2018 |
| CN | 109346484 | A | 2/2019 |
| CN | 107658333 | A | 7/2019 |
| CN | 110047381 | A | 7/2019 |
| CN | 110112142 | A | 8/2019 |
| CN | 110112191 | A | 8/2019 |
| JP | 2007188895 | A | 7/2007 |

OTHER PUBLICATIONS

PCT Written Opinion for International Application No. PCT/CN2019/127333, dated Jun. 23, 2020, 6pp.

* cited by examiner

US 11,329,073 B2

DISPLAY PANEL

TECHNICAL FIELD

The present disclosure relates to a technology field of displays, and more particularly to a display panel.

BACKGROUND

Currently, organic light emitting displays (OLEDs) are more and more popular in applications of wearable device because of low power consumption and bendable characteristics.

To meet reliability requirements of a flexible OLED, it is necessary to repeatedly perform dynamic bending tests on the flexible OLED. However, in a continuous bending process, a problem that cracks are easily generated in film layers of the flexible OLED or the film layers are stripped off occurs. As such, the reliability of the flexible OLED is reduced.

SUMMARY OF DISCLOSURE

A main technical problem solved by the present disclosure is that cracks are easily generated in film layers of a display panel or the film layers are stripped off in a bending test.

In a first aspect, the present disclosure provides a display panel, including: a substrate; a thin film transistor layer, wherein the thin film transistor layer is disposed on the substrate an organic layer; and a via, wherein the via is disposed on the thin film transistor layer, and a part of the organic layer extends to the via; wherein the thin film transistor layer includes an inorganic layer, a buffer layer, an active layer, a first insulating layer, a first metal layer, a second insulating layer, a second metal layer, a third insulating layer, a source electrode, and a drain electrode which are disposed and stacked on the substrate, and the via includes a first via, a second via, a third via, and a fourth via; the part of the organic layer contacts the second metal layer via the first via, the part of the organic layer contacts the first metal layer via the second via, the part of the organic layer contacts the buffer layer via the third via, and the part of the organic layer contacts the active layer via the fourth via; the first via includes a first sub via and a second sub via which are disposed on the third insulating layer, the second via includes a third sub via, the fourth via includes a fourth sub via, and the part of the organic layer is disposed along the first sub via, the second sub via, the third sub via, the third via, and the fourth sub via; the active layer includes a first active pattern and a second active pattern which are disposed interlacedly, the first metal layer includes a first metal pattern and a second metal pattern, the second metal layer includes a third metal pattern, the first active pattern, the first metal pattern, and the third metal pattern are positioned between the source electrode and the drain electrode, and the second metal pattern is correspondingly disposed at one side of the drain electrode spaced from the first metal pattern; the first sub via and the second sub via are positioned between the source electrode and the drain electrode, and the first sub via and the second sub via penetrate the third insulating layer; the third sub via corresponds to the second metal pattern, the third sub via penetrates the third insulating layer, and the part of the organic layer extends to the second metal pattern through the third sub via; the third via is disposed at one side of the third sub via spaced from the second sub via, and the third via penetrates the buffer layer, the first insulating layer, the second insulating layer, and the third insulating layer and extends to the inorganic layer; the fourth sub via is disposed at one side of the third via spaced from the third sub via, the fourth sub via is disposed on the first insulating layer, and the fourth sub via penetrates the second insulating layer and the third insulating layer.

In the display panel provided by the present disclosure, a first through hole is disposed between the second metal pattern and the substrate, and a second through hole is disposed between the second active pattern and the substrate; the first through hole and the second through hole are filled with a photoresist adhesive.

In the display panel provided by the present disclosure, the first through hole penetrates the buffer layer and the first insulating layer, and one surface of the second metal pattern facing the substrate contacts the photoresist adhesive disposed in the first through hole; the second through hole penetrates the buffer layer, and one surface of the second active pattern facing the substrate contacts the photoresist adhesive disposed in the second through hole.

In the display panel provided by the present disclosure, an orthographic projection of the second metal pattern on the substrate covers an orthographic projection of the first through hole on the substrate, and an orthographic projection of the second active pattern on the substrate covers an orthographic projection of the second through hole on the substrate.

In the display panel provided by the present disclosure, the first via further includes a fifth sub via, and the second metal layer further includes a fourth metal pattern; the fourth metal pattern is disposed at one side of the source electrode spaced from the drain electrode, and the fifth sub via penetrates the buffer layer, the first insulating layer, the second insulating layer, the third insulating layer, and the fourth metal pattern.

In the display panel provided by the present disclosure, the second via further includes a sixth sub via; the sixth sub via is disposed on the first insulating layer, the sixth sub via penetrates the first insulating layer, the third sub via connects the sixth sub via, and the part of the organic layer extends to the sixth sub via through the third sub via.

In the display panel provided by the present disclosure, an orthographic projection of the third sub via on the substrate coincides with an orthographic projection of the sixth sub via.

In the display panel provided by the present disclosure, the fourth sub via further includes a seventh sub via; the seventh sub via is disposed on the inorganic layer, the seventh sub via penetrates the second active pattern and the buffer layer, the fourth sub via connects the seventh sub via, and the part of the organic layer extends to the seventh sub via through the fourth sub via.

In the display panel provided by the present disclosure, an orthographic projection of the fourth sub via on the substrate coincides with an orthographic projection of the seventh sub via.

In a second aspect, the present disclosure provides a display panel, including: a substrate; a thin film transistor layer, wherein the thin film transistor layer is disposed on the substrate an organic layer; and a via, wherein the via is disposed on the thin film transistor layer, and a part of the organic layer extends to the via.

In the display panel provided by the present disclosure, the thin film transistor layer includes an inorganic layer, a buffer layer, an active layer, a first insulating layer, a first metal layer, a second insulating layer, a second metal layer, a third insulating layer, a source electrode, and a drain electrode which are disposed and stacked on the substrate, and the via includes a first via, a second via, a third via, and a fourth via; the part of the organic layer contacts the second metal layer via the first via, the part of the organic layer contacts the first metal layer via the second via, the part of the organic layer contacts the buffer layer via the third via, and the part of the organic layer contacts the active layer via the fourth via.

In the display panel provided by the present disclosure, the first via includes a first sub via and a second sub via which are disposed on the third insulating layer, the second via includes a third sub via, the fourth via includes a fourth sub via, and the part of the organic layer is disposed along the first sub via, the second sub via, the third sub via, the third via, and the fourth sub via; the active layer includes a first active pattern and a second active pattern which are disposed interlacedly, the first metal layer includes a first metal pattern and a second metal pattern, the second metal layer includes a third metal pattern, the first active pattern, the first metal pattern, and the third metal pattern are positioned between the source electrode and the drain electrode, and the second metal pattern is correspondingly disposed at one side of the drain electrode spaced from the first metal pattern; the first sub via and the second sub via are positioned between the source electrode and the drain electrode, and the first sub via and the second sub via penetrate the third insulating layer; the third sub via corresponds to the second metal pattern, the third sub via penetrates the third insulating layer, and the part of the organic layer extends to the second metal pattern through the third sub via; the third via is disposed at one side of the third sub via spaced from the second sub via, and the third via penetrates the buffer layer, the first insulating layer, the second insulating layer, and the third insulating layer and extends to the inorganic layer; the fourth sub via is disposed at one side of the third via spaced from the third sub via, the fourth sub via is disposed on the first insulating layer, and the fourth sub via penetrates the second insulating layer and the third insulating layer.

In the display panel provided by the present disclosure, a first through hole is disposed between the second metal pattern and the substrate, and a second through hole is disposed between the second active pattern and the substrate; the first through hole and the second through hole are filled with a photoresist adhesive.

In the display panel provided by the present disclosure, the first through hole penetrates the buffer layer and the first insulating layer, and one surface of the second metal pattern facing the substrate contacts the photoresist adhesive disposed in the first through hole; the second through hole penetrates the buffer layer, and one surface of the second active pattern facing the substrate contacts the photoresist adhesive disposed in the second through hole.

In the display panel provided by the present disclosure, an orthographic projection of the second metal pattern on the substrate covers an orthographic projection of the first through hole on the substrate, and an orthographic projection of the second active pattern on the substrate covers an orthographic projection of the second through hole on the substrate.

In the display panel provided by the present disclosure, the first via further includes a fifth sub via, and the second metal layer further includes a fourth metal pattern; the fourth metal pattern is disposed at one side of the source electrode spaced from the drain electrode, and the fifth sub via penetrates the buffer layer, the first insulating layer, the second insulating layer, the third insulating layer, and the fourth metal pattern.

In the display panel provided by the present disclosure, the second via further includes a sixth sub via; the sixth sub via is disposed on the first insulating layer, the sixth sub via penetrates the first insulating layer, the third sub via connects the sixth sub via, and the part of the organic layer extends to the sixth sub via through the third sub via.

In the display panel provided by the present disclosure, an orthographic projection of the third sub via on the substrate coincides with an orthographic projection of the sixth sub via.

In the display panel provided by the present disclosure, the fourth sub via further includes a seventh sub via; the seventh sub via is disposed on the inorganic layer, the seventh sub via penetrates the second active pattern and the buffer layer, the fourth sub via connects the seventh sub via, and the part of the organic layer extends to the seventh sub via through the fourth sub via.

In the display panel provided by the present disclosure, an orthographic projection of the fourth sub via on the substrate coincides with an orthographic projection of the seventh sub via.

In a third aspect, the present disclosure further provides a display device including the display panel in accordance with any one embodiments of the present disclosure.

Advantageous effect of the present disclosure is described as follows. The via is disposed on the thin film transistor layer, and the part of the organic layer extends to the via. As such, in a bending test, the problem that the cracks are easily generated in film layers of the display panel or the film layers are stripped off can be avoided, thereby increasing the reliability of the display panel.

BRIEF DESCRIPTION OF DRAWINGS

In order to more clearly illustrate the embodiments or the technical schemes in the prior art, the following drawings of the embodiments or in the prior art will be briefly introduced. It is obvious that the drawings are merely some embodiments of the present disclosure, and one of ordinary skill in the art may derive other drawings according the drawings described below without creative endeavor.

DETAILED DESCRIPTION OF EMBODIMENTS

Figure 1:
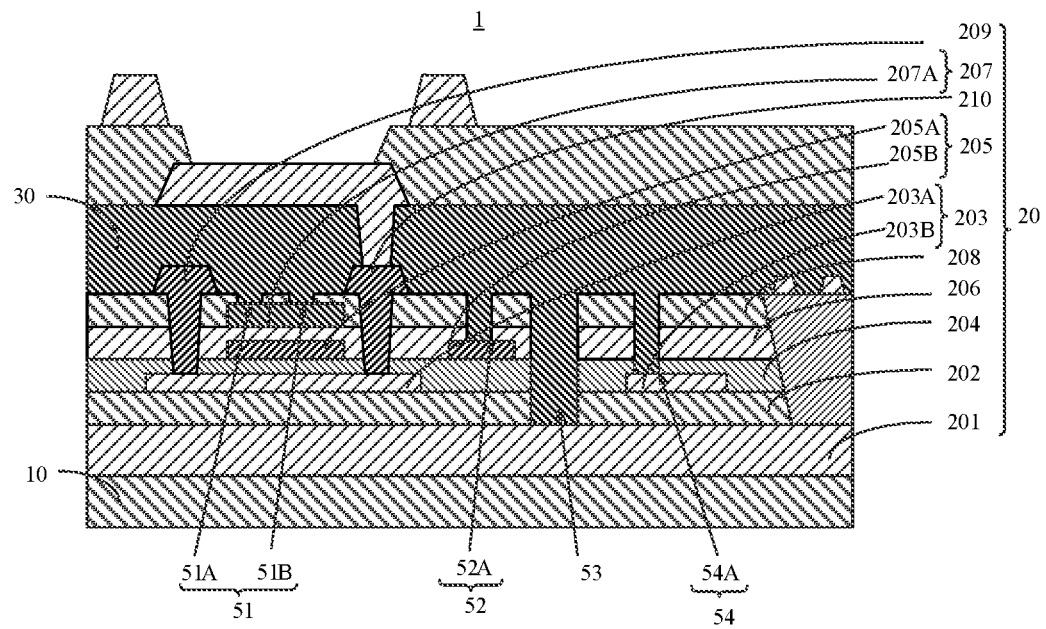
FIG. 1 illustrates a structural diagram of a display panel provided by a first embodiment of the present disclosure.

Hereinafter, exemplary embodiments of the present disclosure will be described with reference to the accompanying drawings. The same or similar elements or the elements with the same or similar functions will be designated by the same or similar reference numerals all through the following description and drawings. The following embodiments described with the accompanying drawings are merely exemplary to explain the present disclosure and not to be construed as limiting the present disclosure.

Please refer to FIG. 1. FIG. 1 illustrates a structural diagram of a display panel provided by a first embodiment of the present disclosure. The present disclosure provides a display panel 1 including a substrate 10, a thin film transistor layer 20, an organic layer 30, and a via 50.

The thin film transistor layer 20 is disposed on the substrate 10. The via 50 is disposed on the thin film transistor layer 20, and a part of the organic layer 30 extends to the via 50.

In the embodiment of the present disclosure, the via 50 is disposed on the thin film transistor layer 20, and the part of the organic layer 30 extends to the via 50. As such, in a bending test, a problem that cracks are easily generated in film layers of the display panel 1 or the film layers are stripped off can be avoided, thereby increasing the reliability of the display panel 1.

Furthermore, please continue to refer to FIG. 1. The thin film transistor layer 20 includes an inorganic layer 201, a buffer layer 202, an active layer 203, a first insulating layer 204, a first metal layer 205, a second insulating layer 206, a second metal layer 207, a third insulating layer 208, a source electrode 209, and a drain electrode 210 which are disposed and stacked on the substrate 10. The via 50 includes a first via 51, a second via 52, a third via 53, and a fourth via 54. The part of the organic layer 30 contacts the second metal layer 207 via the first via 51. The part of the organic layer 30 contacts the first metal layer 205 via the second via 52. The part of the organic layer 30 contacts the buffer layer 202 via the third via 53. The part of the organic layer 30 contacts the active layer 203 via the fourth via 54.

In the embodiment of the present disclosure, the part of the organic layer 30 contacts the second metal layer 207 via the first via 51. The part of the organic layer 30 contacts the first metal layer 205 via the second via 52. The part of the organic layer 30 contacts the buffer layer 202 via the third via 53. The part of the organic layer 30 contacts the active layer 203 via the fourth via 54. As such, in a bending test, a problem that cracks are easily generated in film layers of the display panel 1 or the film layers are stripped off can be avoided, thereby increasing the reliability of the display panel 1.

Furthermore, please continue to refer to FIG. 1. The first via 51 includes a first sub via 51A and a second sub via 51B which are disposed on the third insulating layer 208. The second via 52 includes a third sub via 52A. The fourth via 54 includes a fourth sub via 54A. The part of the organic layer 30 is disposed along the first sub via 51A, the second sub via 51B, the third sub via 52A, the third via 53, and the fourth sub via 54A. The active layer 203 includes a first active pattern 203A and a second active pattern 203B which are disposed interlacedly. The first metal layer 205 includes a first metal pattern 205A and a second metal pattern 205B. The second metal layer 207 includes a third metal pattern 207A. The first active pattern 203A, the first metal pattern 205A, and the third metal pattern 207A are positioned between the source electrode 209 and the drain electrode 210. The second metal pattern 205B is correspondingly disposed at one side of the drain electrode 210 spaced from the first metal pattern 205A.

The first sub via 51A and the second sub via 51B are positioned between the source electrode 209 and the drain electrode 210. The first sub via 51A and the second sub via 51B penetrate the third insulating layer 208. The third sub via 52A corresponds to the second metal pattern 205B. The third sub via 52A penetrates the third insulating layer 208. The part of the organic layer 30 extends to the second metal pattern 205B through the third sub via 52A. The third via 53 is disposed at one side of the third sub via 52A spaced from the second sub via 51B. The third via 53 penetrates the buffer layer 202, the first insulating layer 204, the second insulating layer 206, and the third insulating layer 208 and extends to the inorganic layer 201. The fourth sub via 54A is disposed at one side of the third via 53 spaced from the third sub via 52A. The fourth sub via 54A is disposed on the first insulating layer 204. The fourth sub via 54A penetrates the second insulating layer 206 and the third insulating layer 208.

Figure 2:
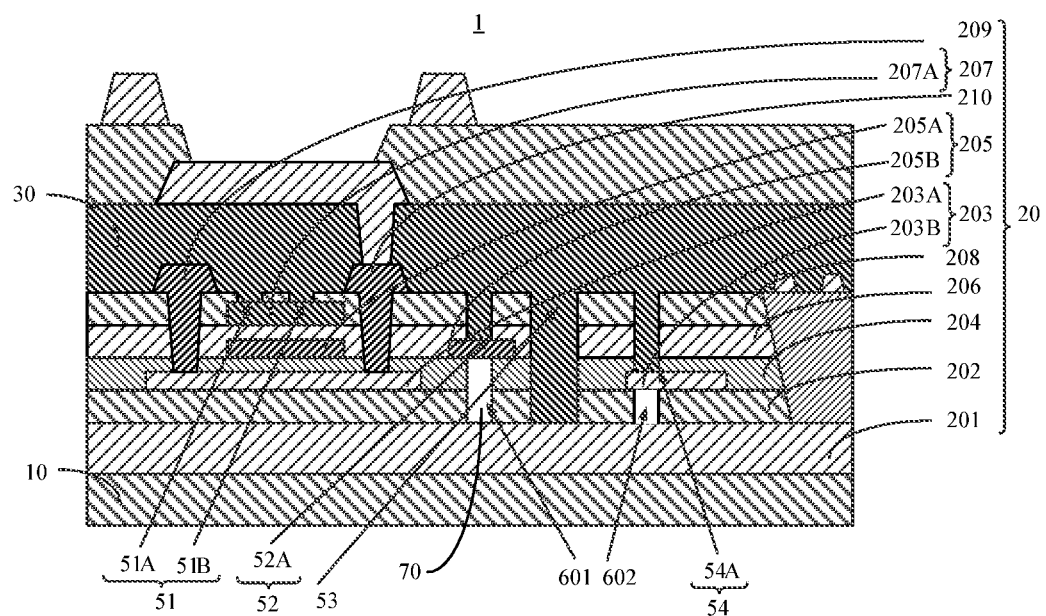
FIG. 2 illustrates a structural diagram of a display panel provided by a second embodiment of the present disclosure.

In some embodiments, please refer to FIG. 2. FIG. 2 illustrates a structural diagram of a display panel provided by a second embodiment of the present disclosure. The present disclosure further provides a display panel 1. Differences between the display panel 1 in FIG. 2 and the display panel 1 in FIG. 1 are that a first through hole 601 is disposed between the second metal pattern 205B and the substrate 10, a second through hole 602 is disposed between the second active pattern 203B and the substrate 10, and the first through hole 601 and the second through hole 602 are filled with a photoresist adhesive 70. The photoresist adhesive 70 is an organic polymer and flexible. In the bending process, the photoresist adhesive 70 can have an elastic buffering function. As a result, stress generated by inorganic film layers in the bending process can be effectively released, and risk and probability of generating the cracks can be decreased. When an area of the first through hole 601 and an area of the second through hole 602 are greater, the organic material filled in the first through hole 601 and the second through hole 602 is more. Stress buffering effect is better.

Furthermore, please continue to refer to FIG. 2. In some embodiments, in order to fill more the photoresist adhesive in the first through hole 601 and the second through hole 602, the first through hole 601 penetrates the buffer layer 202 and the first insulating layer 204, one surface of the second metal pattern 205B facing the substrate 10 contacts the photoresist adhesive 70 disposed in the first through hole 601, the second through hole 602 penetrates the buffer layer 202, and one surface of the second active pattern 203B facing the substrate 10 contacts the photoresist adhesive 70 disposed in the second through hole 602.

In some embodiments, an orthographic projection of the second metal pattern 205B on the substrate 10 covers an orthographic projection of the first through hole 601 on the substrate 10, and an orthographic projection of the second active pattern 203B on the substrate 10 covers an orthographic projection of the second through hole 602 on the substrate 10.

Figure 3:
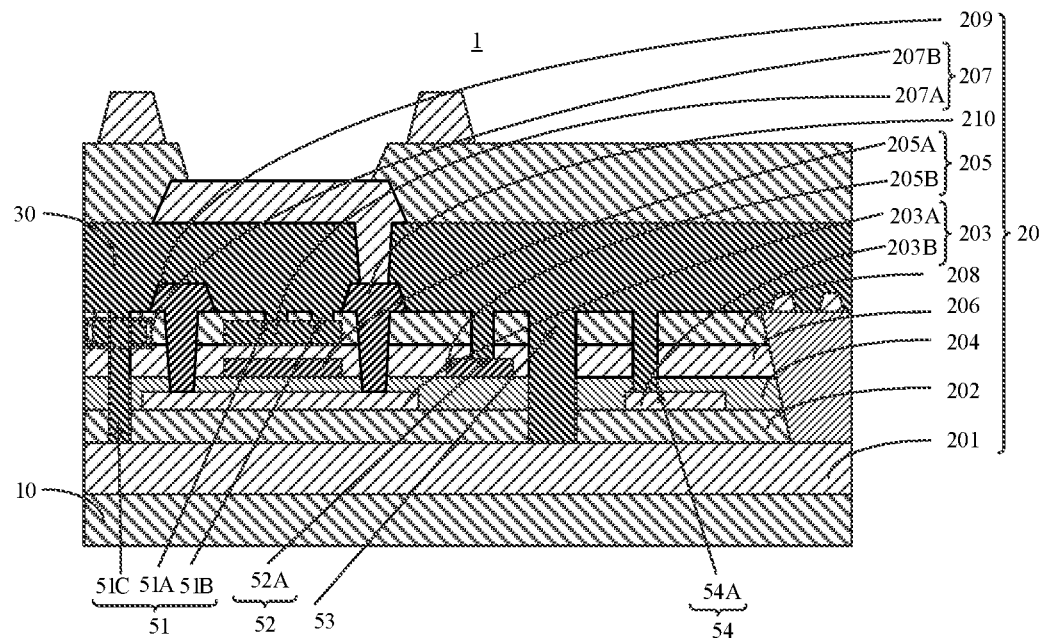
FIG. 3 illustrates a structural diagram of a display panel provided by a third embodiment of the present disclosure.

In some embodiments, please refer to FIG. 3. FIG. 3 illustrates a structural diagram of a display panel provided by a third embodiment of the present disclosure. The present disclosure further provides a display panel 1. Differences between the display panel 1 in FIG. 3 and the display panel 1 in FIG. 1 are that the first via 51 further includes a fifth sub via 51C, the second metal layer 207 further includes a fourth metal pattern 207B, the fourth metal pattern 207B is disposed at one side of the source electrode 209 spaced from the drain electrode 210, and the fifth sub via 51C penetrates the buffer layer 202, the first insulating layer 204, the second insulating layer 206, the third insulating layer 208, and the fourth metal pattern 207B.

The first sub via 51A, the second sub via 51B, the third sub via 52A, the fourth sub via 54A, and fifth sub via 51C are disposed on the thin film transistor layer 20, and the part of the organic layer 30 is disposed in the first sub via 51A, the second sub via 51B, the third sub via 52A, the fourth sub via 54A, and fifth sub via 51C. As such, in a bending test, a problem that cracks are easily generated in film layers of the display panel 1 or the film layers are stripped off can be avoided, thereby increasing the reliability of the display panel 1.

Figure 4:
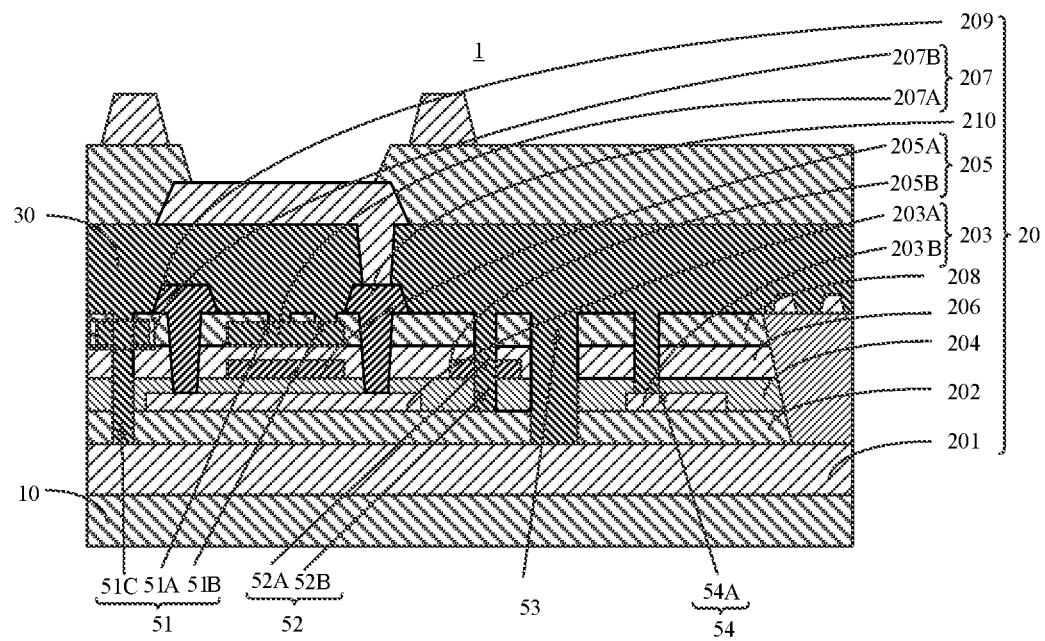
FIG. 4 illustrates a structural diagram of a display panel provided by a fourth embodiment of the present disclosure.

In some embodiments, please refer to FIG. 4. FIG. 4 illustrates a structural diagram of a display panel provided by a fourth embodiment of the present disclosure. The present disclosure further provides a display panel 1. Differences between the display panel 1 in FIG. 4 and the display panel 1 in FIG. 3 are that the second via 52 further includes a sixth sub via 52B, the sixth sub via 52B is disposed on the first insulating layer 204, the sixth sub via 52B penetrates the first insulating layer 204, the third sub via 52A connects the sixth sub via 52B, and the part of the organic layer 30 extends to the sixth sub via 52B through the third sub via 52A.

In some embodiments, an orthographic projection of the third sub via 52A on the substrate 10 coincides with an orthographic projection of the sixth sub via 52B. It is noted that an meaning that the orthographic projection of the third sub via 52A on the substrate 10 coincides with the orthographic projection of the sixth sub via 52B refers to that an area of the third sub via 52A is the same as an area of the sixth sub via 52B. That is, when the display panel 1 is bent, a stress situation of the third sub via 52A is the same as a stress situation of the sixth sub via 52B. A situation that the film layers are stripped off does not occur.

Figure 5:
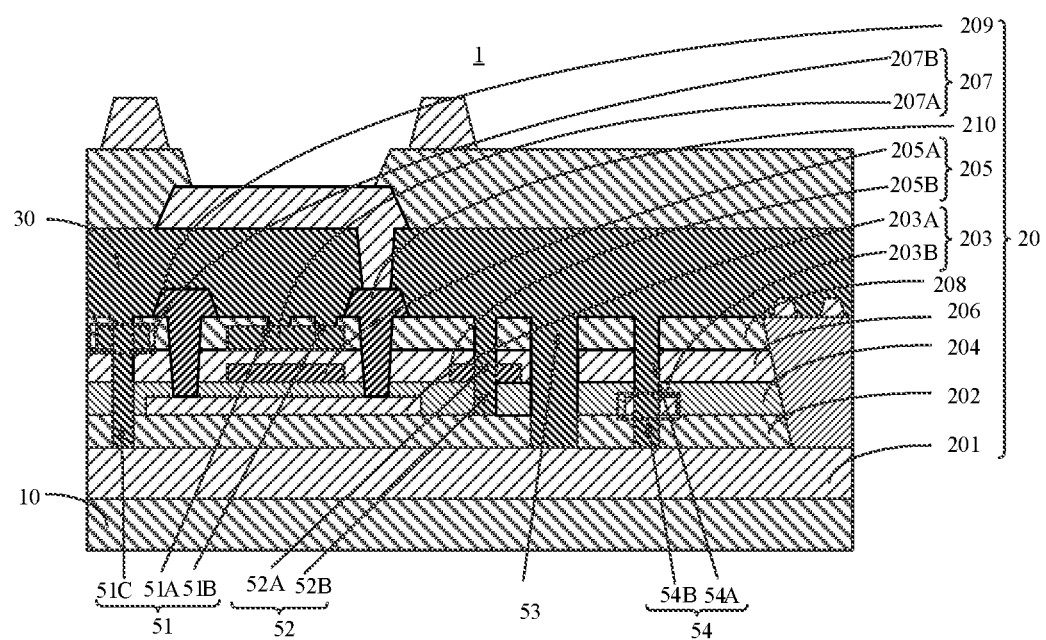
FIG. 5 illustrates a structural diagram of a display panel provided by a fifth embodiment of the present disclosure.

In some embodiments, please refer to FIG. 5. FIG. 5 illustrates a structural diagram of a display panel provided by a fifth embodiment of the present disclosure. The present disclosure further provides a display panel 1. Differences between the display panel 1 in FIG. 5 and the display panel 1 in FIG. 5 are that the fourth sub via 54A further includes a seventh sub via 54B, the seventh sub via 54B is disposed on the inorganic layer 201, the seventh sub via 54B penetrates the second active pattern 203B and the buffer layer 202, the fourth sub via 54A connects the seventh sub via 54B, and the part of the organic layer 30 extends to the seventh sub via 54B through the fourth sub via 54A.

In some embodiments, an orthographic projection of the fourth sub via 54A on the substrate 10 coincides with an orthographic projection of the seventh sub via 54B. It is noted that an meaning that the orthographic projection of the fourth sub via 54A on the substrate 10 coincides with the orthographic projection of the seventh sub via 54B refers to that an area of the fourth sub via 54A is the same as an area of the seventh sub via 54B. That is, when the display panel 1 is bent, a stress situation of the fourth sub via 54A is the same as a stress situation of the seventh sub via 54B. A situation that the film layers are stripped off does not occur.

Correspondingly, the present disclosure further provides a display device including the display panel provided by any one of the embodiments of the present disclosure. Detailed descriptions can be referred to the above-mentioned embodiments and are not repeated herein.

The display panels provided by the embodiments of the present disclosure are described in detail as above. The embodiments are used to describe the principle and the implementations of the present disclosure. It should be understood that present disclosure is not limited to the exemplary examples. One of ordinary skill in the art may achieve equivalent improvements or replacements according to the above description. The equivalent improvements and replacements should be considered to belong to the protection scope of the present disclosure.

What is claimed is:
1. A display panel, comprising:
a substrate;
a thin film transistor layer, wherein the thin film transistor layer is disposed on the substrate;
an organic layer; and
a via, wherein the via is disposed on the thin film transistor layer, and a part of the organic layer extends to the via;
wherein the thin film transistor layer comprises an inorganic layer, a buffer layer, an active layer, a first insulating layer, a first metal layer, a second insulating layer, a second metal layer, a third insulating layer, a source electrode, and a drain electrode which are disposed and stacked on the substrate, and the via comprises a first via, a second via, a third via, and a fourth via;
the part of the organic layer contacts the second metal layer via the first via, the part of the organic layer contacts the first metal layer via the second via, the part of the organic layer contacts the buffer layer via the third via, and the part of the organic layer contacts the active layer via the fourth via;
the first via comprises a first sub via and a second sub via which are disposed on the third insulating layer, the second via comprises a third sub via, the fourth via comprises a fourth sub via, and the part of the organic layer is disposed along the first sub via, the second sub via, the third sub via, the third via, and the fourth sub via;
the active layer comprises a first active pattern and a second active pattern which are disposed interlacedly, the first metal layer comprises a first metal pattern and a second metal pattern, the second metal layer comprises a third metal pattern, the first active pattern, the first metal pattern, and the third metal pattern are positioned between the source electrode and the drain electrode, and the second metal pattern is correspondingly disposed at one side of the drain electrode spaced from the first metal pattern;
the first sub via and the second sub via are positioned between the source electrode and the drain electrode, and the first sub via and the second sub via penetrate the third insulating layer;
the third sub via corresponds to the second metal pattern, the third sub via penetrates the third insulating layer, and the part of the organic layer extends to the second metal pattern through the third sub via;
the third via is disposed at one side of the third sub via spaced from the second sub via, and the third via penetrates the buffer layer, the first insulating layer, the second insulating layer, and the third insulating layer and extends to the inorganic layer;
the fourth sub via is disposed at one side of the third via spaced from the third sub via, the fourth sub via is disposed on the first insulating layer, and the fourth sub via penetrates the second insulating layer and the third insulating layer;
a first through hole is disposed between the second metal pattern and the substrate, and a second through hole is disposed between the second active pattern and the substrate;
the first through hole and the second through hole are filled with a photoresist adhesive.
2. The display panel of claim 1, wherein the first through hole penetrates the buffer layer and the first insulating layer, and one surface of the second metal pattern facing the substrate contacts the photoresist adhesive disposed in the first through hole;

the second through hole penetrates the buffer layer, and one surface of the second active pattern facing the substrate contacts the photoresist adhesive disposed in the second through hole.

3. The display panel of claim 2, wherein an orthographic projection of the second metal pattern on the substrate covers an orthographic projection of the first through hole on the substrate, and an orthographic projection of the second active pattern on the substrate covers an orthographic projection of the second through hole on the substrate.

4. The display panel of claim 1, wherein the first via further comprises a fifth sub via, and the second metal layer further comprises a fourth metal pattern;

the fourth metal pattern is disposed at one side of the source electrode spaced from the drain electrode, and the fifth sub via penetrates the buffer layer, the first insulating layer, the second insulating layer, the third insulating layer, and the fourth metal pattern.

5. The display panel of claim 4, wherein the second via further comprises a sixth sub via;

the sixth sub via is disposed on the first insulating layer, the sixth sub via penetrates the first insulating layer, the third sub via connects the sixth sub via, and the part of the organic layer extends to the sixth sub via through the third sub via.

6. The display panel of claim 5, wherein an orthographic projection of the third sub via on the substrate coincides with an orthographic projection of the sixth sub via.

7. The display panel of claim 5, wherein the fourth sub via further comprises a seventh sub via;

the seventh sub via is disposed on the inorganic layer, the seventh sub via penetrates the second active pattern and the buffer layer, the fourth sub via connects the seventh sub via, and the part of the organic layer extends to the seventh sub via through the fourth sub via.

8. The display panel of claim 7, wherein an orthographic projection of the fourth sub via on the substrate coincides with an orthographic projection of the seventh sub via.

\* \* \* \* \*